United States Patent [19]
Nakatani et al.

[11] Patent Number: 5,476,063
[45] Date of Patent: Dec. 19, 1995

[54] METHOD OF PRODUCTION OF SINGLE CRYSTAL

[75] Inventors: Isao Nakatani; Satoshi Takahashi; Isao Nishida; Kiyoshi Ozawa, all of Ibaraki, Japan

[73] Assignees: National Research Institute for Metals; National Space Development Agency of Japan, both of Tokyo, Japan

[21] Appl. No.: 284,983

[22] Filed: Aug. 4, 1994

[30] Foreign Application Priority Data

Aug. 4, 1993 [JP] Japan ................. 5-193762

[51] Int. Cl.⁶ ..................................... C30B 13/06
[52] U.S. Cl. ................. 117/11; 117/1; 117/3; 117/49
[58] Field of Search ............... 117/1, 3, 11, 49, 117/50, 51, 52, 901

[56] References Cited

U.S. PATENT DOCUMENTS 4,615,260  10/1986  Dressler ........................ 117/901

FOREIGN PATENT DOCUMENTS 2289488  11/1990  Japan ........................ 117/901
2289487  11/1990  Japan ........................ 117/901

OTHER PUBLICATIONS

Kölker, 5th European Symmposium on Material Sciences Under Microgravity, "Crystallization of a Silicon Sphere", pp. 169–172, Nov., 1984.

*Primary Examiner*—R. Bruce Breneman
*Assistant Examiner*—Felisa Garrett
*Attorney, Agent, or Firm*—Wenderoth, Lind & Ponack

[57] ABSTRACT

A seed crystal is connected with a polycrystal at one end of the polycrystal, the connected crystal material is melted under a zero-gravity or microgravity environment without any container, and a single crystal is grown.

7 Claims, 9 Drawing Sheets

5,476,063

METHOD OF PRODUCTION OF SINGLE CRYSTAL

FIELD OF THE INVENTION

The present invention relates to a method of producing a single crystal. More particularly, the present invention relates to a method of producing a large single crystal having a low density of crystalline defects, good quality and a uniform composition.

DESCRIPTION OF THE PRIOR ART

With regard to making a single crystal, various methods have been conventionally known. For example, a melt growth method in which a melt is slowly solidified, and a solution growth method in which a solution of raw materials is cooled gradually have been provided. To avoid crystalline defects or inhomogeneity in composition and make a perfect single crystal, a zero-gravity environment such as in space or orbit has been utilized. For instance, a melt or solution is cooled under a floating state without using any container, and a crystal is made. This method is called a container-less method, and it is a stable method for making a highly pure crystal because any contamination from a container can be completely avoided. A large crystal is also made because a melt of large size can be supported without any container under the zero-gravity environment. At the beginning of crystal growth experiments in space, a perfect crystal without any defect or inhomogeneity was expected to be realized on the grounds that convection due to gravity does not occur and crystal growth proceeds in a melt or solution without any influence of disturbance.

It is certain that a convection flow due to gravity does not take place under such a zero-gravity environment, but it is, however, shown by the three material experiments in the trials of the space shuttles that a flow derived from surface tension (Marangoni flow) occurred. This flow severly disturbs a melt or solution, and the resulting crystal is not much better in quality than one produced under a gravity environment. This fact suggests to us that the critical influence for the disturbance of a melt or solution is ratchet a flow derived from surface tension than a gravity-convection flow. For example, an experiment of solidification of the molten floating zone of a silicon single crystal is performed. In this experiment, an oxide was coated on a part of the silicon single crystal having added boron as an impurity. The single crystal was subjected to melting and solidification subsequently, and then a comparison on of striations between the portion coated with the oxide film and uncoated was conducted. It was found that striations occurred at the portion uncoated with the oxide film due to the non-uniform distribution of the boron. On the other hand, no striation was found at the portion coated with oxide film. From this experimental result, it was understood that there is no disturbance in the melt at the portion coated with the oxide film.

This invention has an object to provide a method of producing single crystals which realizes a large size single crystal having low density of crystalline defects, good quality and uniform composition.

This and other objects, features and advantages of the present invention will become more apparent upon a reading of the following detailed specification and drawings.

DETAILED DESCRIPTION OF THE INVENTION

The present invention provides a method of producing a single crystal, comprising the steps of connecting a seed crystal to one end of a polycrystal, melting a thus connected crystal material without any container under a zero-gravity or microgravity environment, and causing a single crystal to grow.

Figure 1:
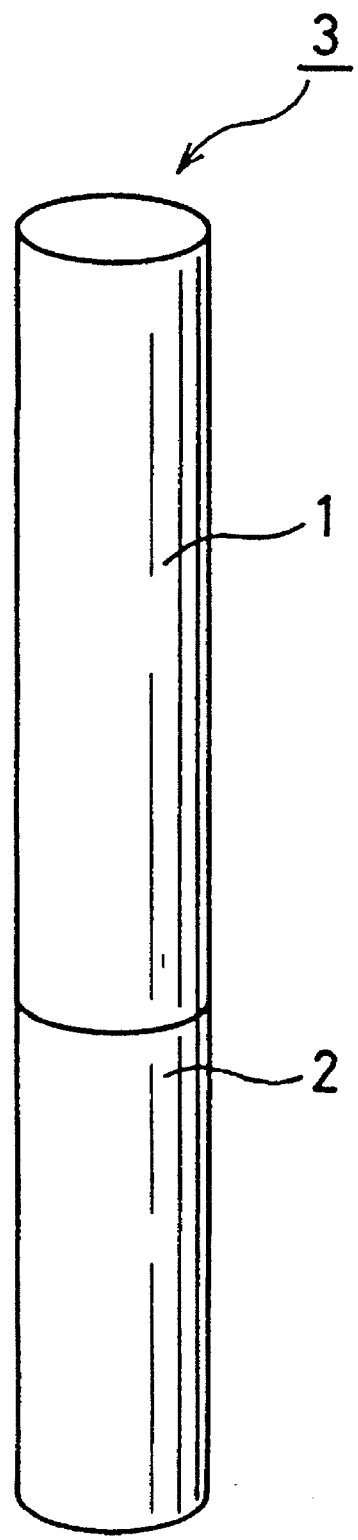
FIG. 1 is a perspective view depicting an embodiment of a raw material for a method of producing single crystals according to the present invention.

As depicted in FIG. 1, for example, a raw material (3) is used in the present invention. This raw material (3) substantially consists of a seed crystal (2) and a polycrystal (1), and the seed crystal (2) is connected with the lower end of the polycrystal (1). There is no limitation concerning to the way of connecting of these two crystals (1) (2). A Bridgiman method using a container, a zone melting, for example, or any other method can be adopted. A single crystal can be used as a seed crystal (2).

This raw material (3) can be ground into an appropriate shape. The shape of the raw material (3) can be varied to be suitable with the intended application of the single crystal to be prepared, and it is desirable to match the shape with one inherent to the objective material and fit for the single crystallization. More preferably, it should be one of the hydrodynamically most stable shapes. Such hydrodynamically stable shape can be analytically determined so as to minimize a surface energy of all of the melt of the raw material (3). This shape is generally a smooth one having a gentle curve. For example, a cylindrical shape as in FIG. 1 and a spherical one as in FIG. 2 typify the shape.

Figure 3:
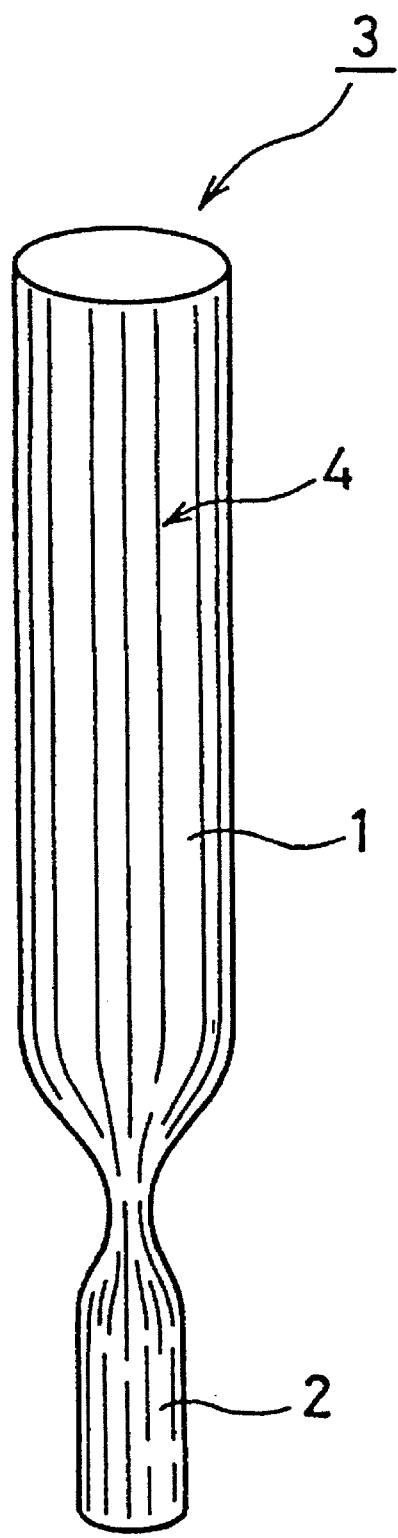
FIG. 3 is a perspective view depicting a material polished to form a mirror surface.

As illustrated in FIG. 3, the surface of the raw material (3) can be polished to form a mirror surface (4). Subsequently, a thin oxide film (5) is formed on the surface of the raw material (3). This oxide film (5) is formed by treating the material in oxygen plasma at room temperature for approximate one minute, or by heating it to an appropriate temperature lower than the melting point of the material in an oxygen-inert gas mixture. There is no particular limitation with regard to the thickness of the oxide film (5). It is preferably from 100 to several 100 nm, for example.

The foregoing steps can be arranged. It is possible to mold the polycrystal (1) and the seed crystal (2) into an appropriate shape, polish them for forming the mirror surface, and then connect them to each other. A single crystal is made from this raw material (3) under a zero-gravity or microgravity environment using a containerless method. The zero-gravity or microgravity environment can be realized, for example, in a space shuttle in orbit or in a space station.

Figure 5:
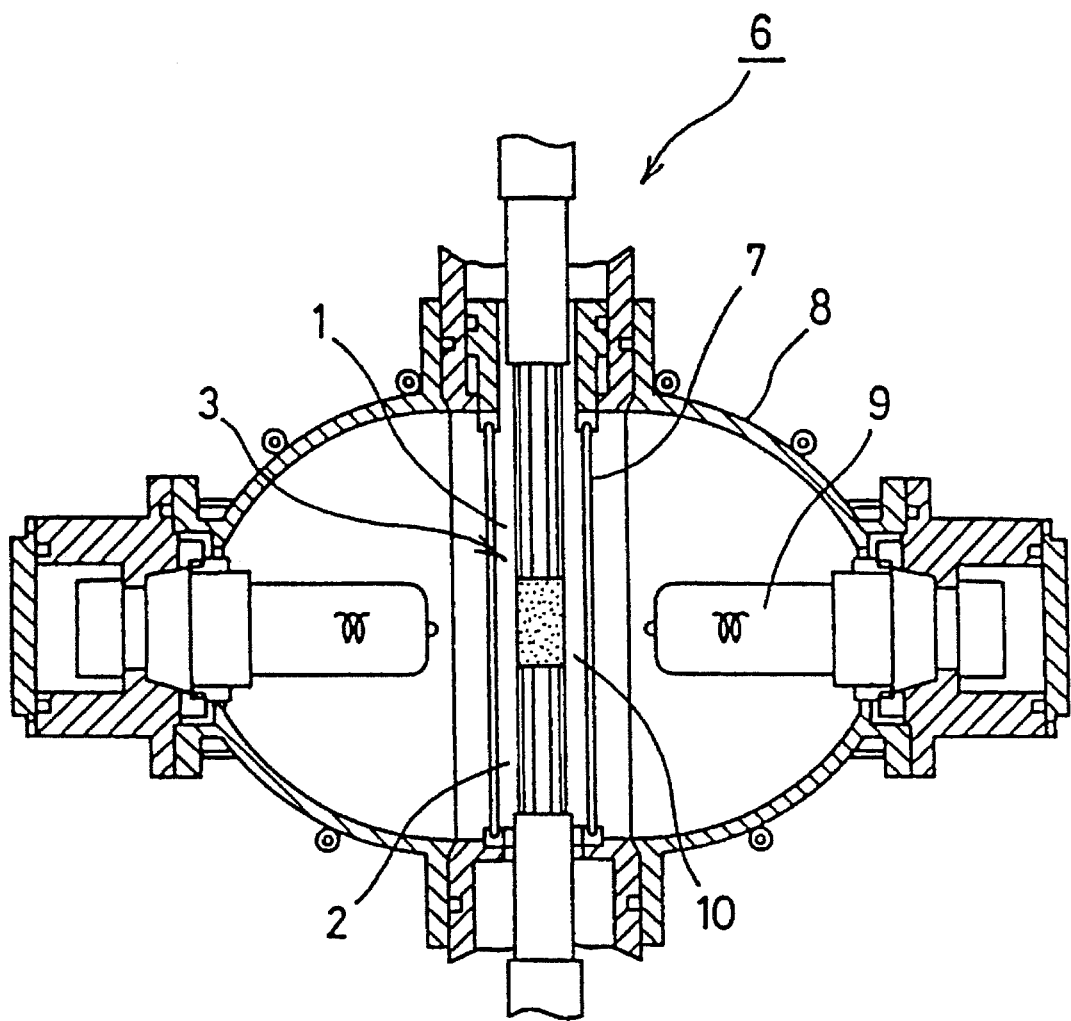
FIG. 5 is a cross sectional view depicting an image furnace that can be utilized for this invention.

A floating zone melting process using an image furnace (6) as depicted in FIG. 5 can be applied to a containerless method. Needless to say, the containerless method need not be restricted to an image furnace.

Figure 6:
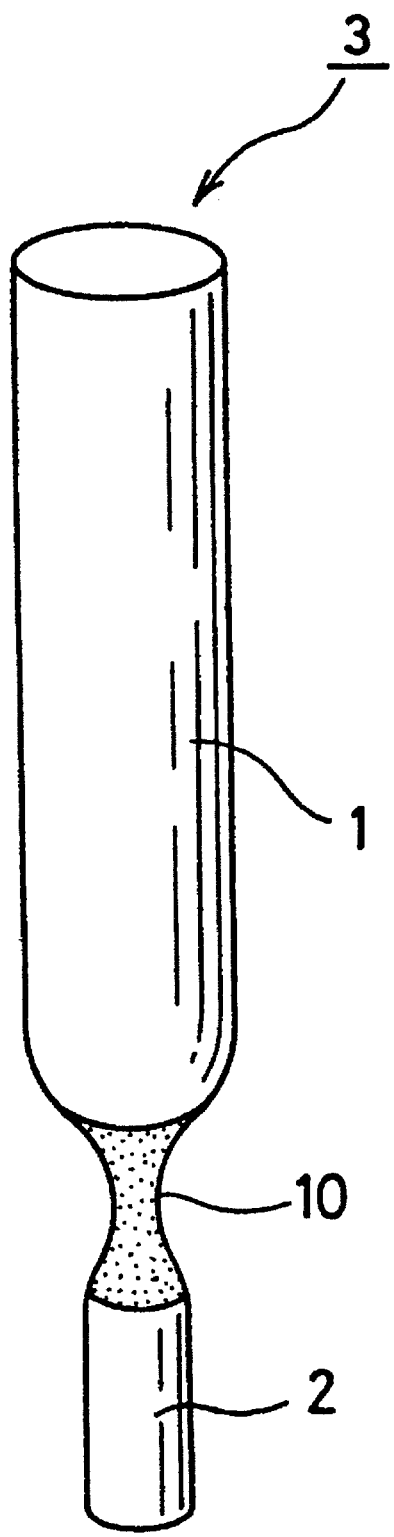
FIG. 6 is a perspective view depicting a step of a heat melting treatment.
Figure 7:
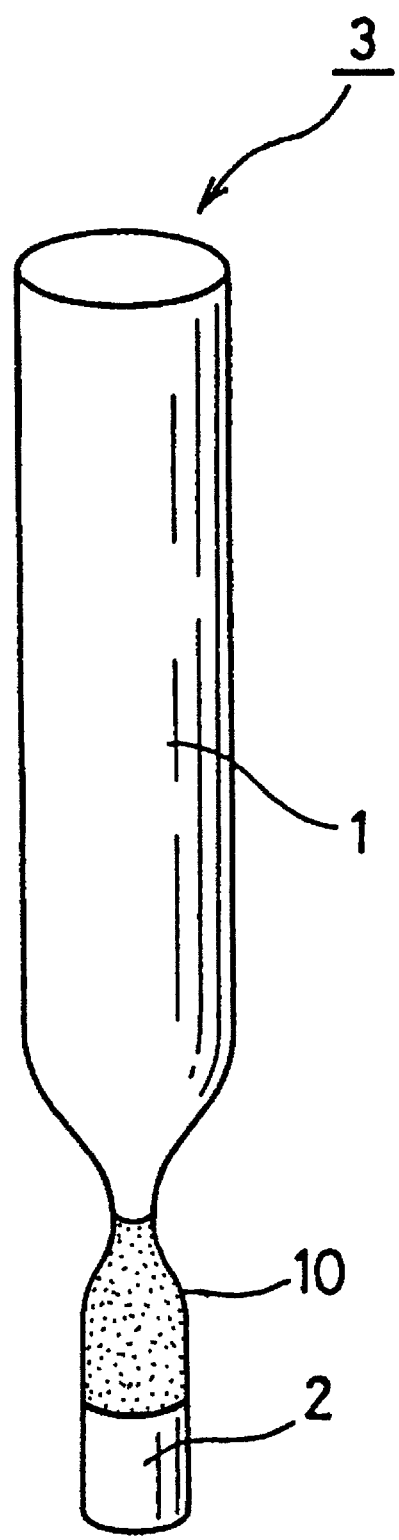
FIG. 7 is a perspective view depicting another step of a heat melting treatment.

The raw material (3) is mounted in the inside of a silica tube (7) of the image furnace (6), the focus of a reflecting mirror (8) having an ellipsoidal shape is aligned to the connected surface between the seed crystal (2) and the polycrystal (1). Subsequently, the rays from a halogen lamp (9) used as a heat source is gradually increased while the raw material (3) is rotated at a constant speed and the connected portion is locally heated to melt it and form a molten zone (10) as illustrated in FIG. 6. After that, as depicted in FIG. 7, the molten zone, i.e., a floating zone (10) is moved a little toward the side of the seed crystal (2) by slowly moving the reflecting mirror (8) downward, and then, a seeding operation is conducted to connect the seed crystal (2) with the polycrystal (1) by redirecting the reflecting mirror (8) upward. The aforesaid process permits the crystal orientation of the seed crystal to be inmparted to a single crystal to be grown, and concurrently, prevents the crystal defects contained in the seed crystal from being transmitted to the single crystal.

Figure 8:
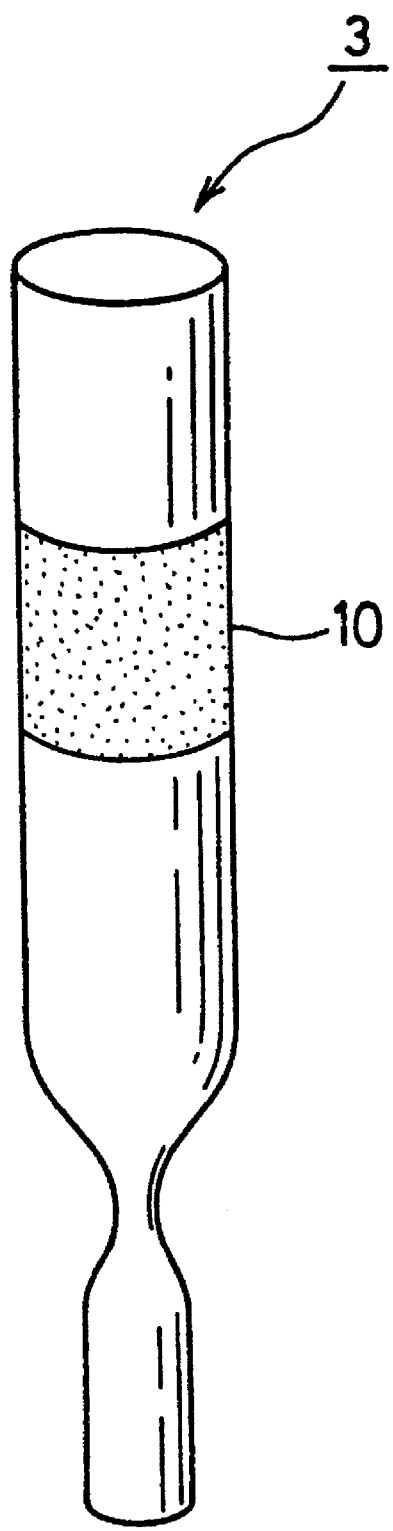
FIG. 8 is a perspective view depicting yet another step of a heat melting treatment.
Figure 9:
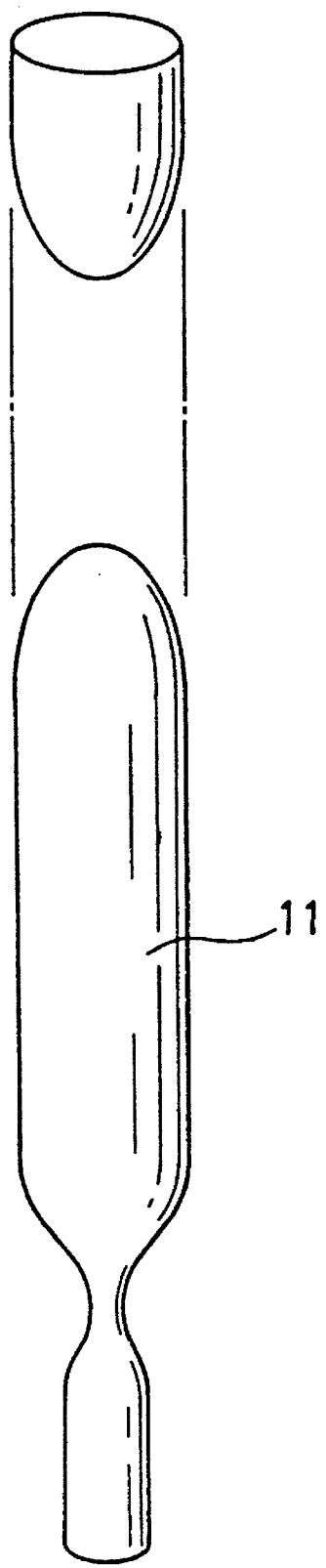
FIG. 9 is a perspective view depicting a single crystal obtained by the invention

As illustrated in FIG. 8, the reflecting mirror (8) of the image furnace (6) in FIG. 5 is moved upward at a constant speed, moving the floating zone (10) from the lower to the upper portion of the raw material (3). The portion through which this floating zone (10) traverses becomes a high-grade single crystal. When a desired length is attained, the raw material (3) is separated, and the floating zone (10) is cut off from it. The resulting product is cooled and a single crystal (11) as illustrated in FIG. 9 is obtained. During the foregoing process under a zerogravity or microgravity environment, no heat convection occurs. Since the raw material (3) is covered with a coating layer in a solid state, any flow derived from surface tension does not occur, and therefore, the melt does not absolutely flow. Moreover, the melt is not transformed on account of the hydrodynamically stable shape of the, raw material (3). Even a very thin oxide film (5) is not absolutely wrinkled or broken.

Figure 2:
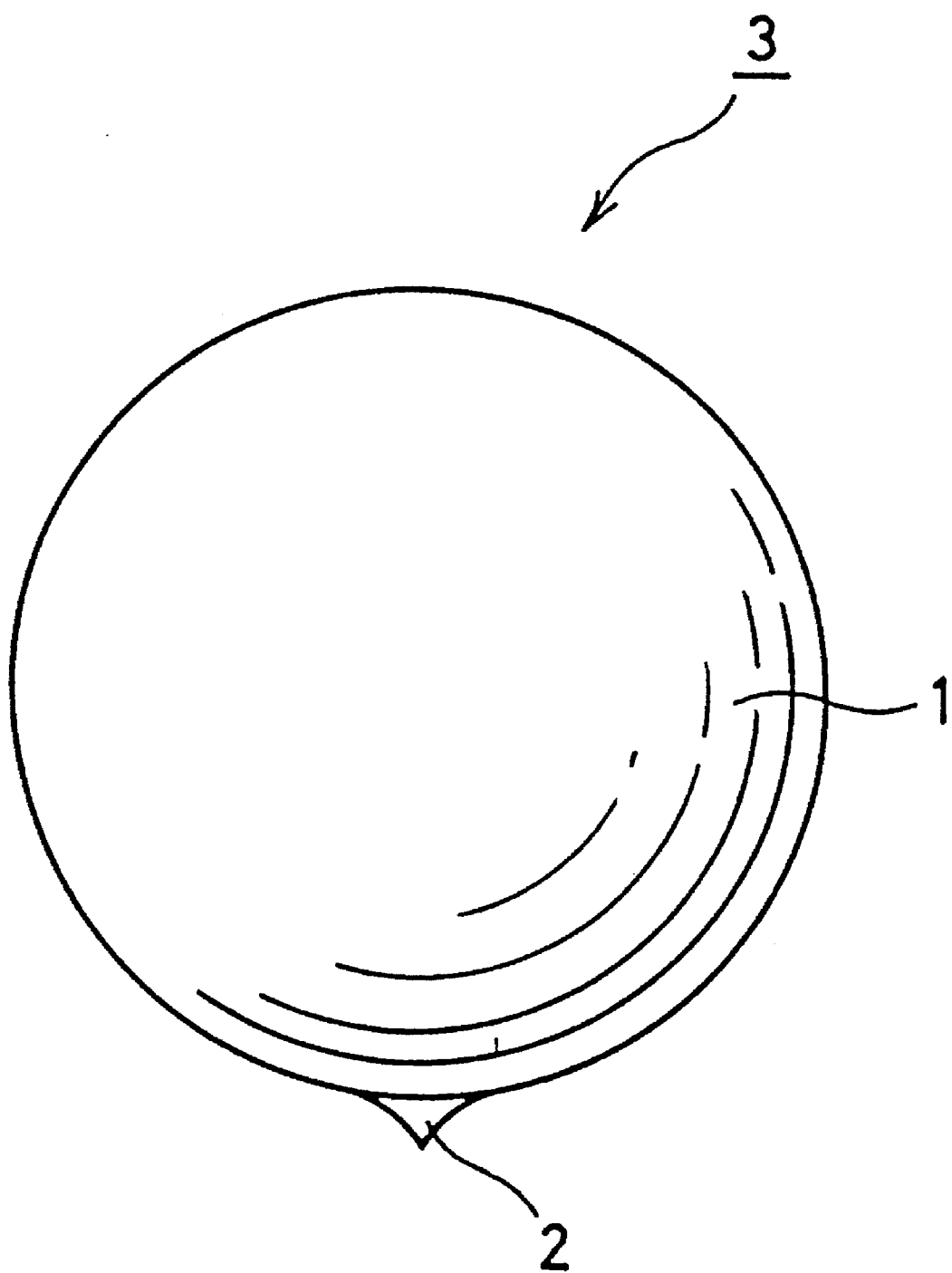
FIG. 2 is a perspective view depicting another embodiment of the raw material.
Figure 4:
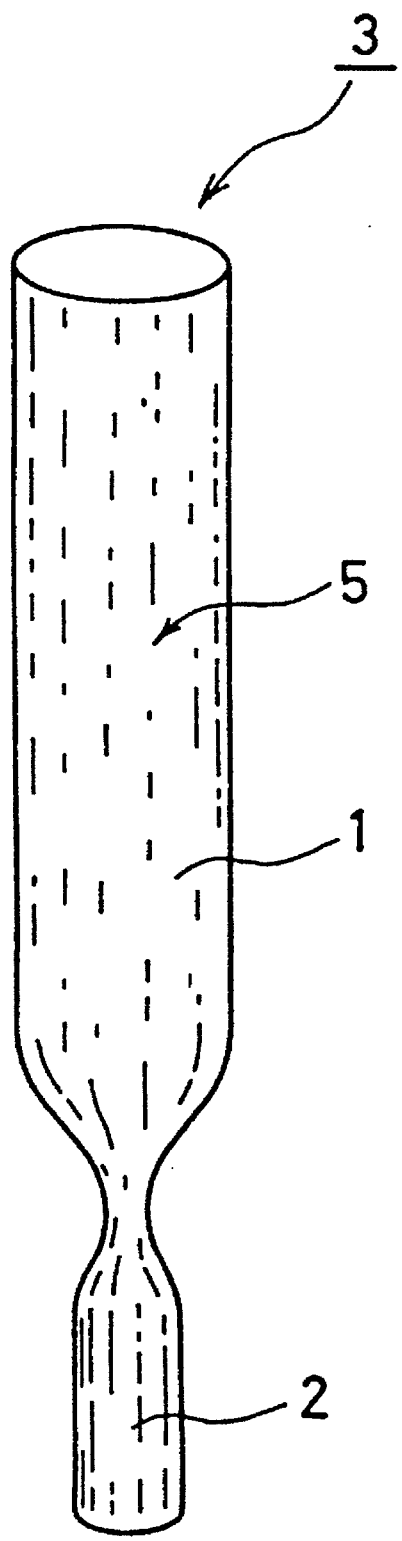
FIG. 4 is a perspective view depicting a raw material on which an oxide film is formed.

In the above process, the steps of connecting the seed crystal (2) with the polycrystal (1) as depicted in FIGS. 1 and 2, and of forming an oxide film (5) on the surface of the raw material (3) as illustrated in FIG. 4 can be consecutively performed under a zero-gravity or microgravity environment. In this case, by using an inert gas of relatively low purity as a, crystal growth atmosphere gas, melting occurs by heating. The polycrystal (1) and the seed crystal (2) are brought into contact with each other, and the surface of the melt is weakly oxidized, thus forming a uniform oxide film (5) so as to cover the surface. Heat convection occurs under a gravity environment such as on earth, and therefore, such a thin oxide film (5) is wrinkled or broken. This makes it difficult to uniformly wrap the surface of the melt. On the other hand, the formation of the oxide film (5) under a microgravity environment such as in space makes it possible to produce a higher grade single crystal. Further, the consecutive process can be realized, and many troubles are removed.

In a method of producing single crystals according to the present invention, a seed crystal is connected with one end of a polycrystal, and a single crystal is grown up by melting the connected material without any container under a zero-gravity or microgravity environment. Therefore, the melt by heating is supported between the polycrystal and the seed crystal, and it never sag or spill. There is no gravi- ty-induced convection under a microgravity environment. The melt is covered with a thin film and has no free surface. These completely prevent a flow according to surface tension that cannot normally be offset under a zero-gravity environment. It becomes possible to completely eliminate the disturbance of the melt that causes crystal defects and inhomogeneity in composition. The melt maintains its shape by the thin oxide film. Further, the hydrodynamically stable shape prevents the thin oxide film from being wrinkled or broken during a crystal growth process, and helps keep the shape of a great deal of the melt as it is. Therefore, a large-sized single crystal is realized. Moreover, the melt is crystallized while being sealed in the oxide film, and the oxide film is so thin and flexible that it applies no stress to the crystal body during crystallization. A crystal without any slip, twin or other crystal defect is formed. Since an oxide of a constituent element of a single crystal can be used as the oxide film, it permits no contamination into the single crystal, and a high quality single crystal is produced.

The present invention will be more clearly understood with reference to the following embodiment.

EMBODIMENT

The space shuttle Endeavor (Spacelab 1 mission) was employed as a space in which a microgravity environment was created. A single crystal of a compound semiconductor of indium antimonide and an indium antimonide polycrystal were used for a seed crystal and a raw material, respectively. They were rod-shaped specimens with each diameter of 20 mm. These specimens had been polished to form a mirror surface on the earth and been subjected to chemical polishing and baking. A single crystal was made in an image furnace disposed in a zero-gravity space lab of the Endeavor.

The indium antimony single crystal was mounted on the lower shaft in the silica tube (7) of the image furnace (6) as depicted in FIG. 5 and the polycrystal was mounted on the upper shaft. These shafts were rotated in the same direction at 6 rpm. The image furnace (6) was evacuated. After producing a vacuum of $6.0 \times 10^{-6}$ Torr, a high purity argon gas was introduced into the furnace at a rate of 1800 cm$^3$ per minute. The output of halogen lamps (9) as a heat source of the image furnace (6) was gradually raised, the opposite tips of the specimens were melted and connected together, and a molten floating zone was formed. The power of the halogen lamps was set at approximately 200 W. At this time, the melt was covered with a thin oxide film, and the free surface of the melt having metallic luster disappeared. The oxide film is considered to be produced through chemical reaction between impurity gases left after the evacuation such as a moisture or absorbed gasses on the specimens.

Subsequently, the floating zone was moved downward at a rate of 0.50 mm/min for 20 minutes, the seed crystal was molten, and a seeding operation was conducted. A crystal growth operation was performed while the floating zone was moved upward for 10 minutes at a rate of 0.33 mm/min. After the crystal was grown, the floating zone was cut out from the upper and lower portions and subjected to slow cooling. During these steps, the oxide film retained its initial shape without breakage or disappearance, covering the surface of the melt. Even when irregular external vibrations were introduced into the melt, the film freely transformed itself and acted as a flexible container of the melt.

The indium antimonide single crystal thus produced was brought back to earth, and analyzed for its inner crystallographic properties. No striation was confirmed. A striation is known to be characteristic when the melt was disturbed. This fact is attributable to the grounds that any flow according to surface tension was not generated and that the crystal grew. The frequency of face-shaped defects such as twin boundaries and stacking defects was tremendously decreased as compared with one prepared on the earth (under the gravity environment) under conditions where the oxide film was not formed, or, under conditions in which both a gravity-induced convection and a flow based on surface tension existed. The thin oxide film can be considered to be flexible enough to give the growing crystal no stress that causes secondary defects during the crystallization process. The etch pit density was approximately $10^2$, about one-tenth as much as that for crystals produced on the earth.

As described in detail above, the present invention permits the production of a high grade single crystal without any crystal defect or inhomogeneity in composition which has fewer slips or twins based on strains and less contamination with impurities. A large-sized single crystal can also be produced. A zero-gravity or microgravity environment such as in outer space can be utilized effectively.

The present invention is not restricted to the foregoing embodiment. Various modifications are possible in detail.

What is claimed is:

1. A method of producing a single crystal, comprising the steps of connecting a seed crystal to one end of a polycrystal to form a connected crystal material, forming a thin film coating on a surface of the connected crystal material, said thin film coating containing one or more of the constituent elements of the connected crystal material and having a higher melting point than the connected crystal material, and melting the connected crystal material to form a melt without a container under a zero-gravity or microgravity environment, and causing the single crystal to grow.

2. A method of producing a single crystal as claimed in claim 1, wherein said connected crystal material is formed into a hydrodynamically most stable shape.

3. A method of producing a single crystal as claimed in claim 2, comprising the step of finishing a surface of said connected crystal material smoothly.

4. A method of producing a single crystal as claimed in claim 1, wherein said thin film coating has a thickness within a range of from 100 nm to several 100 nm.

5. A method of producing a single crystal coating as claimed in claim 1 wherein said thin film coating is an oxide film coating produced by reacting said connected crystal material with oxygen.

6. A method or producing a single crystal as claimed in claim 1 wherein said thin film coating covers the entire surface of the connected crystal material and acts as a flexible container for the melt.

7. A method of producing a single crystal as claimed in claim 1 wherein the thin film coating is an oxide film formed from a chemical reaction between the connected crystal material and impurity gases surrounding the connected crystal material.

* * * * *